United States Patent [19]
Okazawa

[11] Patent Number: 5,523,969
[45] Date of Patent: Jun. 4, 1996

[54] ELECTRICALLY ERASABLE PROGRAMMABLE NON-VOLATILE SEMICONDUCTOR MEMORY DEVICE AND METHOD FOR MANUFACTURING THE SAME

[75] Inventor: Takeshi Okazawa, Tokyo, Japan

[73] Assignee: NEC Corporation, Japan

[21] Appl. No.: 319,117

[22] Filed: Oct. 6, 1994

[30] Foreign Application Priority Data

Oct. 6, 1993 [JP] Japan .................................. 5-249643

[51] Int. Cl.$^6$ ................................................ G11C 13/00
[52] U.S. Cl. ...................... 365/185.13; 365/185.06; 257/344; 257/316
[58] Field of Search .................................. 365/182, 185, 365/45, 189.01, 126, 900, 185.01, 185.06, 185.12, 185.29

[56] References Cited

U.S. PATENT DOCUMENTS 5,218,569  6/1993  Banks ...................... 365/185

OTHER PUBLICATIONS

H. Onoda, et al., "*A Novel Cell Structure Suitable for a 3 Volt Operation, Sector Erase Flash Memory*", IEEE, IEDM 92, pp. 599–602, 1992.

M. Momodomi, et al., "*New Device Technologies for 5V–Only 4Mb EEPROM With NAND Structure Cell*", IEEE, IEDM 88, pp. 412–415, 1988.

*Primary Examiner*—Terrell W. Fears

[57] ABSTRACT

A flash memory includes a plurality of blocks each having a plurality of memory cells located at intersections between a plurality of row lines and at least one sub column line, and at least one main column line connected to said at least one sub column line of each of said blocks through a selection transistor. Both of said memory cells and said selection transistor have a floating gate electrode and a control gate electrode. The selection transistor has a drain region of the lightly doped drain structure in which a low impurity concentration diffused region is located at a channel side thereof.

3 Claims, 13 Drawing Sheets

5,523,969

ELECTRICALLY ERASABLE PROGRAMMABLE NON-VOLATILE SEMICONDUCTOR MEMORY DEVICE AND METHOD FOR MANUFACTURING THE SAME

BACKGROUND OF THE INVENTION

1. Field of the invention

The present invention relates to an electrically erasable programmable non-volatile semiconductor memory, and a method for manufacturing the same.

2. Description of Related Art

Of electrically erasable programmable non-volatile semiconductor memories, a memory including a plurality of memory cells and having a function of simultaneously erasing the memory cells as a whole, is called a "flash memory". For example, this type memory is described in M. Momodomi et al "NEW DEVICE TECHNOLOGIES; FOR 5 V-ONLY Mb EEPROM WITH NAND STRUCTURE CELL", IEDM 88, pp412–415, (1988 IEEE) and in H. Onoda et al "A NOVEL CELL STRUCTURE SUITABLE FOR A 3 VOLT OPERATION, SECTOR ERASE FLASH MEMORY", IEDM 92, pp 599–602 (1992 IEEE), the disclosure of which is incorporated by reference in their entirety into the present application.

Referring to FIG. 1, there is shown a circuit diagram illustrating one conventional example of this type non-volatile semiconductor memory. The shown example includes sixteen memory cells $M_{11}$ to $M_{18}$ and $M_{21}$ to $M_{28}$ which are controlled through eight row lines (word lines $W_1$ to $W_8$) and two main column lines (main bit lines $B_1$ and $B_2$). The eight row lines $W_1$ to $W_8$ and the two main column lines $B_1$ and $B_2$ are divided into first four row lines $W_1$ to $W_4$ and second four row lines $W_5$ to $W_8$, and a first main column line $B_1$ and a second main column line $B_2$, respectively, so that the whole of the memory is divided into four blocks $BK_{11}$ to $BK_{22}$.

In the blocks $BK_{11}$ to $BK_2$, sub colunto lines (sub bit lines $SB_1$ to $SB_4$) are provided respectively in addition to the main column lines. Each of the sub column lines is connected to the memory cells in a corresponding block, and is connected through a selection transistor $ST_1$ to $ST_4$ to a corresponding one of the main column lines. Any block can be selected by supplying a voltage signal to a selection line $S_1$ or $S_2$ so that a corresponding selection transistor $ST_1$ to $ST_4$ is turned on to transfer a potential of the main column line to the sub column line connected to the turned-on selection transistor. Provision of these selection transistors $ST_1$ to $ST_4$ makes it possible to completely isolate the memory cells in units of block.

In the blocks, a source of the memory cells $M_{11}$ to $M_{18}$ and $M_{21}$ to $M_{28}$ are connected to source lines $G_1$ or $G_2$. Incidentally, the row lines $W_1$ to $W_8$ and the selection lines $S_1$ and $S_2$ are controlled by a row decoder $PC_1$, and the main column lines $B_1$ and $B_2$ are controlled by a peripheral circuit $PC_2$ including a column decoder, sense amplifiers and a write circuit which are not shown in the drawing.

Here, referring to FIGS. 2, 3A and 3B, FIG. 2 illustrates a layout pattern diagram of an actual flash memory having the circuit construction shown in FIG. 1, and FIGS. 3A and 3B shows diagrammatic sectional views taken along; the lines A—A and B—B in FIG. 2. In this conventional structure, the memory cell has a stacked gate structure having a floating gate electrode 41a and a control gate electrode 6a, and on file other hand, the selection transistor has an ordinary MOS structure including a gate electrode which also function as a selection line 6b corresponding to for example the selection line $S_1$ in FIG. 1.

Now, a conventional process for manufacturing the memory cell and the selection transistor will be described with reference to FIGS. 4A to 4D illustrating a process for manufacturing the memory cell and FIG. 5A to 5D illustrating a process for manufacturing the selection transistor.

First, as shown in FIGS. 4A and 5A, on a principal surface of a P-type silicon substrate having the concentration of $10^{16}$ to $10^{17}$ cm$^{-3}$, a device isolation structure (field oxide film 2) is formed so as to partition first and second device formation regions. A first gate insulator film 31 having a thickness of about 10 nm is formed in the first device formation region, and a second gale insulator film 32 having a thickness of about 20 nm is formed in the second device formation region.

Furthermore, a first floating gate polysilicon film 41 is formed to cover the first device formation region, corresponding to the memory cell and a neighboring region surrounding the first device formation region. Thereafter, as shown in FIGS. 4A and 5B, a third insulator film 5 is formed to cover the first floating gate polysilicon film 41, and a second polysilicon film 6 is formed to cover the third insulator film 5 and the second gate insulator film 32 in the second device formation region.

Then, as shown in FIGS. 4C and 5C, a first photoresist layer 71 and 72 is formed on a selected area of the second polysilicon film 6 within the first and second device formation regions. Within the first device formation region, the second polysilicon film 6, the third gate insulator film 5 and the first floating gate polysilicon film 41 are etched in the named order, so as to form a stacked gate structure composed of a floating gate electrode 41a, a floating gate upper insulator film 5a and a control gate electrode 6a, as well as a word line 6a (corresponding to the row line $W_1$) for interconnecting the control gate electrode of the memory cells arranged in line in a row direction. Furthermore, arsenic (As) is implanted to the silicon substrate principal surface within the first device formation region which is not covered with the stacked structure, so that high impurity concentration N-type diffused layers 91s and 91d are formed.

Finally, as shown in FIGS. 4D and 5D, a photoresist layer 101 and 102 is formed on a selected area or the second polysilicon film 6 within the first and second device formation regions, and an etching is performed using the photoresist layer as a mask, so as to form a selection line 6b (corresponding to the selection line $S_1$) which also acts as a selection gate electrode. In addition, arsenic (As) is implanted to the silicon substrate principal surface which is not covered with the selection line 6b, so that high impurity concentration N-type diffused layers 92s and 92d are formed. Thereafter, as shown in FIGS. 3A and 3B, an interlayer insulating film 15 is deposited, and a contact hole $C_1$ is formed. Further, a first layer aluminum alloy film 16 is deposited and then patterned to as to form a source line 16 (corresponding to the source line $G_1$) and a sub bit line 16 (corresponding to the sub column line $SB_1$). Then, an interlayer insulating film 17 is deposited, and a contact hole $C_2$ is formed, and further, a second layer aluminum alloy film 18 is deposited and then patterned to as to form a main bit line 18 (corresponding to the column line $B_1$).

Now, another conventional process for manufacturing the memory cell and the selection transistor will be described with reference to FIGS. 6A to 6D illustrating a process; for manufacturing the memory cell and FIG. 7A to 7D illustrating a process for manufacturing the selection transistor.

First, as shown in FIGS. 6A and 7A, on a principal surface of a P-type silicon substrate, a field oxide film 2 is formed so as to partition first and second device formation regions. A first gate insulator film 31 having a thickness of about 10 nm is formed in the first device formation region, and a second gate insulator film 32 having a thickness of about 20 nm is formed in the second device formation region.

Furthermore, first and second floating gate polysilicon films 41 and 42 are formed to cover the first and second device formation regions and a neighboring region surrounding the first and second device formation regions. Thereafter, a third gate insulator film 5 is formed to cover the whole of the substrate principal surface, and a photoresist layer 11 having an opening 12 on the third insulator film 5 above the second floating gate polysilicon film 42, is formed. The third insulator film 5 in the opening 12 of the photoresist layer 11 is etched, so that a contact hole 13 is formed as shown in FIG. 7B. In the first device formation region for the memory cell, no contact hole is formed as shown in FIG. 6B.

Thereafter, as shown in FIGS. 6C and 7C, a second polysilicon film 6 is formed to cover the whole surface. Here, in second device formation region for the selection transistor, the second polysilicon film 6 is connected to the second floating gate polysilicon film 42 through the contact hole 13.

Then, as shown in FIGS. 6C and 7C, a photoresist layer 141 and 142 is formed on a selected area within the first and second device formation regions. The second polysilicon film 6, the second gate insulator film 5 and the first and second floating gate polysilicon films are etched in the named order, so as to form stacked gate structures 81 and 82 as shown in FIGS. 6D and 7D, as well as a word line and a selection line. Finally, arsenic (As) (N-type impurity) is implanted to the silicon substrate principal surface, so that high impurity concentration diffused layers $91s$ and $91d$ and $92s$ and $92d$ are formed. Thereafter, sub bit lines $SB_1$ and $SB_2$, source lines $G_1$ and $G_2$, and main bit lines $B_1$ and $B_2$ are formed.

Now, an writing (namely, programming) operation of the above mentioned type of memory cell cell will be described. In this memory cell having the stacked gate structure, the memory operation is performed by changing the threshold level between a low threshold level condition (about 2 V) and a high threshold level condition (about 7 V). As one example, it is assumed that the low threshold level condition is a written condition and the high threshold level condition is an erased condition.

In order to bring the memory cells $M_{11}$ to $M_{14}$ and $M_{21}$ to $M_{24}$ into the erased condition, for example, the main bit lines $B_1$ and $B_2$, the P-silicon substrate 1 and the source lines $G_1$ and $G_2$ are all brought to 0 V (ground potential). Furthermore, 15 V is applied to only the word lines $W_1$ to $W_4$, and the other word lines $W_5$ to $W_8$ are set at 0 V.

In addition, the first and second selection lines $S_1$ and $S_2$ are set to 5 V, respectively. Thus, in the memory cells $M_{11}$ to $M_{14}$ and $M_{21}$ to $M_{24}$, electrons are injected from the P-silicon substrate to the floating gate through the first gate insulator film between the floating gate and the silicon substrate.

On the other hand, in the case of selecting and writing for example the memory cell $M_{14}$, the main bit line $B_1$ is brought to 5 V, and the main bit line $B_2$, the P-silicon substrate 1, and the source lines $G_1$ and $G_2$ are all set to 0 V. −13 V is applied to only the control gate electrode of the memory cell $M_{14}$ (word line $W_4$), and the other word lines $W_1$ to $W_3$ an $W_5$ to $W_8$ are set to 0 V. The first and second selection lines $S_1$ and $S_2$ are set to 5 V and 0 V, respectively. In this case, −18 V is applied between the drain region ($91d$) of the memory cell $M_{14}$ and the control gate $W_4$, so that electrons are discharged from the floating gate to the silicon substrate through the first gate insulator film between the floating gate and the silicon substrate.

As the result of the fact that the electrons has been drawn from the floating gate, the potential of the floating gate electrode is caused to elevate to a positive level. Therefore, the threshold of the memory cell $M_{14}$ is shifted toward a negative direction. As mentioned above, the threshold level of the written memory cell is ordinarily set on the order of 2 V.

In the above mentioned non-volatile semiconductor memory, the memory cells have the stacked gate structure including the floating gate electrode, but the selection transistor is constituted of either the ordinary MOS transistor or the transistor having a structure which is similar to that of the memory cell but in which the floating gate electrode is interconnected to the control gate electrode. The reason for this is as follows: The selection transistor is provided for connecting the sub bit line in each block to the corresponding main bit line, and therefore, the potential on the main bit line is given to the sub line line through the selection transistor. Therefore, the selection transistor is required to operate with a ceaselessly constant threshold voltage.

In the transistor having the floating gate structure as the memory cell, on the other hand, the threshold of the transistor varies because electric charges are accumulated in the floating gate. In an ordinary reading operation under a voltage lower than the writing voltage, electric charges are gradually slightly injected, with the result that it is not possible to avoid the change of the threshold. Here, even if it is assumed that the selection transistor is constituted to have the same floating structure as that of the memory cell, the electric charges are gradually injected in the ordinary reading operation, with the result that the threshold voltage varies and finally malfunction occurs.

From another viewpoint, the fact that the ordinary MOS transistor is formed in proximity of the above mentioned memory cell, has the following problems:

First, the number of necessary manufacturing steps is large. This is particularly remarkable in the case that the selection transistor is constituted of the ordinary MOS transistor in accordance with the process described with reference to FIGS. 4A to 4D and 5A to 5D. In this process, the memory cell and the selection transistor cannot be in common to each other in most of necessary manufacturing steps. For example, in order to form the polysilicon film for the floating gate only on the first device formation region and its neighboring area, the first polysilicon film is deposited to cover the whole surface, and thereafter, is removed from the region (including the second device formation regions) other than the first device formation region and its neighboring area, so that the first polysilicon film is left only on the-first device formation region and its neighboring area.

In addition, the source/drain diffused regions for the memory cell and the source/drain diffused regions for the selection transistor are formed in a process independent of each other. Therefore, it is not possible to avoid the increase of the number of necessary manufacturing steps as a whole.

In the case that the selection transistor is constituted of the transistor having the structure similar to that of the memory cell but including the floating gate electrode connected to the control gate electrode, in accordance with the process described with reference to FIGS. 6A to 6D and 7A to 7D, on the other hand, the memory cell and the selection transistor can be in common to each other in most of necessary manufacturing steps, and therefore, the number of necessary manufacturing steps can be greatly reduced. In this case, however, the lithographic steps (including a photoresist deposition, exposure, development, etching and resist removing) are increased. In addition, since the contact hole for connecting the selection line to the floating gate electrode is formed, it is not possible to reduce the size of the gate electrode of the selection transistor to a value less than the size of the contact hole plus the mask alignment margin.

SUMMARY OF THE INVENTION

Accordingly, it is an object of the present invention to provide an electrically erasable programmable non-volatile semiconductor memory, which has overcome the above mentioned defect of the conventional one.

Another object of the present invention is to provide an electrically erasable programmable non-volatile semiconductor memory having a selection transistor having a constant threshold which will not almost change.

Still another object of the present invention is to provide a method for manufacturing the electrically erasable programmable non-volatile semiconductor memory, which has overcome the above mentioned defect of the conventional one.

A further object of the present invention is to provide a method for manufacturing the electrically erasable programmable non-volatile semiconductor memory, with a reduced number of manufacturing steps.

The above and other objects of the present invention are achieved in accordance with the present invention by a non-volatile semiconductor memory including:

a plurality of blocks each having a plurality of memory cells located at intersections between a plurality of row lines and at least one sub column line; and at least one main column line connected to the at least one sub column line of each of the blocks through a selection transistor, both of the memory cells and the selection transistor having a floating gate electrode and a control gate electrode, at least the selection transistor having a drain region of the lightly doped drain structure in which a low impurity concentration diffused region is located at a channel side thereof.

Preferably, the low impurity concentration diffused region has the impurity concentration of $10^{19}$ cm$^{-3}$ at maximum. In addition, in the selection transistor, a gate insulator film between the floating gate electrode and the control gate electrode is thicker than that between a channel surface and the floating gate electrode.

According to another aspect of the present invention, there is provided a method for manufacturing a non-volatile semiconductor memory comprising the steps:

forming a device isolation structure on a principal surface of a semiconductor substrate of a first conductivity type so as to partition a first device formation region and a second device formation region;

forming a first gate insulator film and a second gate insulator film on the principal surface of tile semiconductor substrate in the first device formation region and the second device formation region, respectively;

depositing a first polycrystalline semiconductor film on the whole surface of tile semiconductor substrate and patterning the deposited first polycrystalline semiconductor film, so as to form a first floating gate polycrystalline semiconductor film covering the first device formation region and a neighboring area and a second floating gate polycrystalline semiconductor film covering the second device formation region and a neighboring area;

depositing a third gate insulator film and a second polycrystalline semiconductor film in the named order;

patterning the second polycrystalline semiconductor film, the third gate insulator film and the first and second floating gate polycrystalline semiconductor film, so as to form a memory cell stacked gate structure and a selection transistor stacked gate structure in the first device formation region and the second device formation region, respectively, and to form a word line of the second polycrystalline semiconductor film connected to the control gale electrode of memory cells arranged in a row direction as well as a selection line of the second polycrystalline semiconductor film connected to the control gate electrode of selection transistors arranged in a row direction;

performing a first ion implantation using the memory cell stacked gate structure and the selection transistor stacked gate structure as a mask, so as to form low impurity concentration diffused layers of a second conductivity type opposite to the first conductivity type at the principal surface of the semiconductor substrate in the first device formation region and the second device formation region, respectively;

depositing an insulator film on the whole of the principal surface and perforating an anisotropic etching so as to form a spacer on each side wall of each of the memory cell stacked gate structure and the selection transistor stacked gate structure; and performing a second ion implantation using as a mask the memory cell stacked gate structure and the selection transistor stacked gate structure each having the spacer formed on each side wall thereof, so as to form high impurity concentration diffused layers of the second conductivity type at the principal surface of the semiconductor substrate in the first device formation region and the second device formation region, respectively.

The above and other objects, features and advantages of the present invention will be apparent from the following description of preferred embodiments of the invention with reference to the accompanying drawings.

BRIEF DESCRIPTION OF THE DRAWINGS

FIG. 12A to 12D illustrating a conventional process for manufacturing the selection transistor shown in FIG. 10B.

DESCRIPTION OF THE PREFERRED EMBODIMENTS

Figure 1:
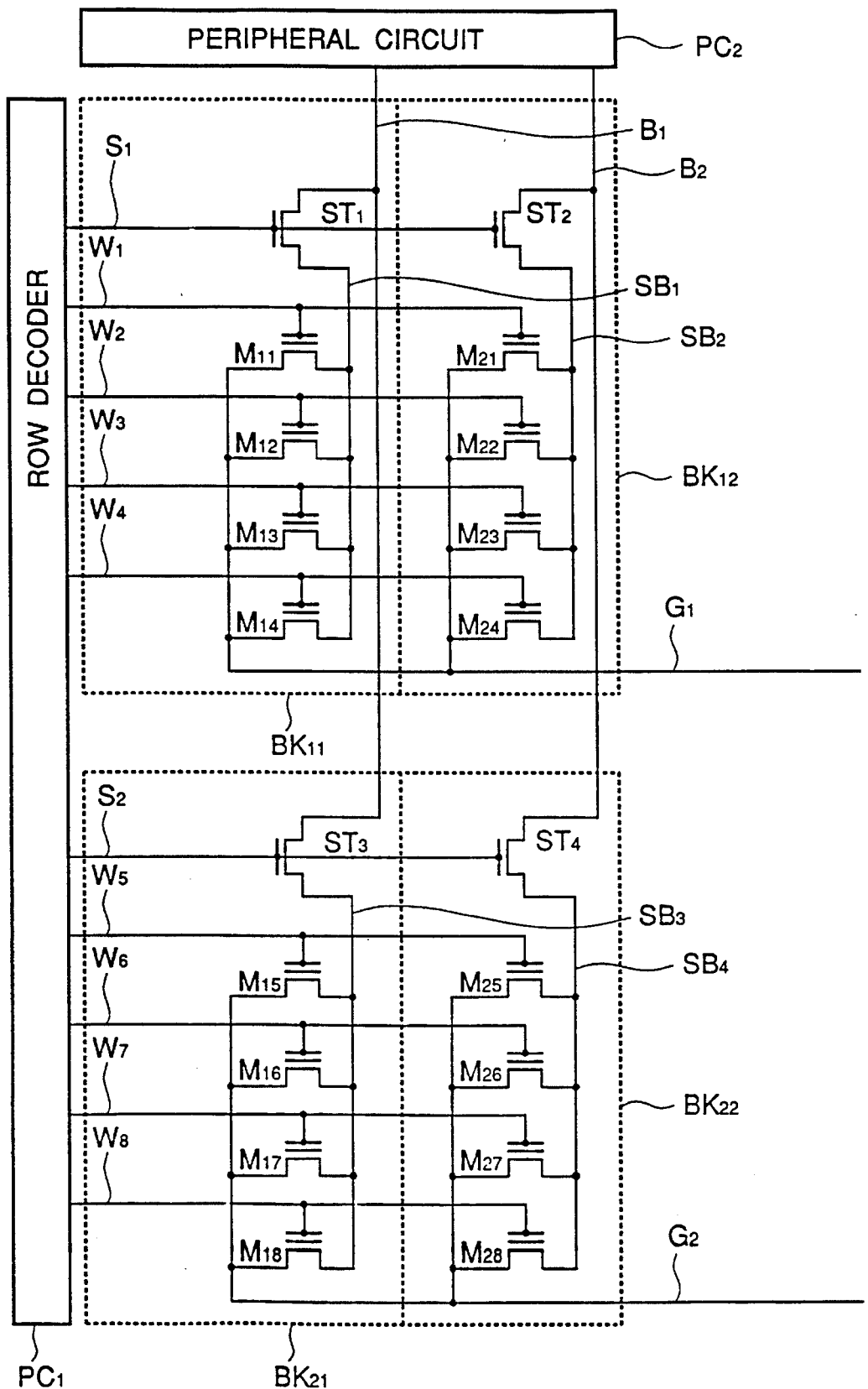
FIG. 1 is a circuit diagram illustrating one conventional example of this type non-volatile semiconductor memory.
Figure 8:
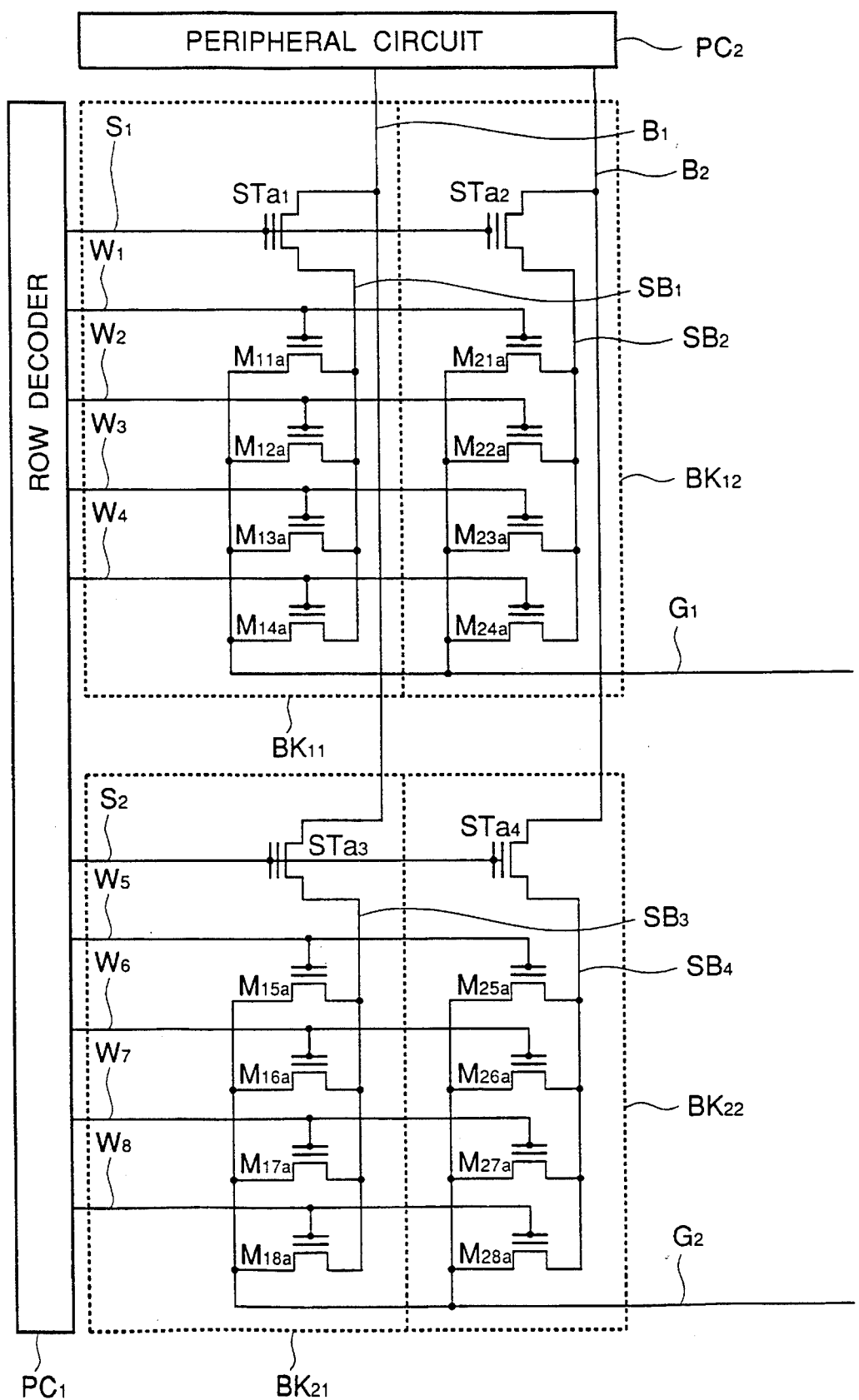
FIG. 8 is a circuit diagram illustrating one embodiment of the non-volatile semiconductor memory in accordance with the present invention.

Referring to FIG. 8 there is shown a circuit diagram illustrating one embodiment of the non-volatile semiconductor memory in accordance with the present invention. In FIG. 8, elements corresponding to those shown in FIG. 1 are given the same Reference Numerals or Signs.

The shown embodiment includes includes sixteen memory cells $M_{11a}$ to $M_{18a}$ and $M_{21a}$ to $M_{28a}$ which are controlled through eight row lines (word lines $W_1$ to $W_8$) and two main column lines (main bit lines $B_1$ and $B_2$). The eight row lines $W_1$ to $W_8$ are divided into first four row lines $W_1$ to $W_4$ and second four row lines $W_5$ to $W_8$, and the two main column lines $B_1$ and $B_2$ are divided into a first main column line B I and a second main column line $B_2$, respectively, so that the whole of the memory is divided into four blocks $BK_{11}$ to $BK_{22}$.

In the blocks $BK_{11}$ to $BK_{22}$, sub column lines (sub bit lines $SB_1$ to $SB_4$) are provided respectively in addition to the main column lines. Each of the sub column lines is connected in parallel to a drain of the memory cells in a corresponding block, and is connected through a selection transistor $ST_{1a}$, $ST_{2a}$, $ST_{3a}$ or $ST_{4a}$ to a corresponding one of the main column lines ($B_1$ or $B_2$). In the blocks $BK_{11}$ and $BK_{12}$, gates of the selection transistors $ST_{1a}$ and $ST_{2a}$ are connected to a selection line $S_1$, and a source of the memory cells $M_{11a}$ to $M_{14a}$ and $M_{21a}$ to $M_{24a}$ are connected to a corresponding source line $G_1$. In the blocks $BK_{21}$ and $BK_{22}$, gates of of the selection transistors $ST_{3a}$ or $ST_{4a}$ are connected to a selection line $S_2$, and a source of the memory cells $M_{15a}$ to $M_{18a}$ and $M_{25a}$ to $M_{28a}$ are connected to a corresponding source line $G_2$.

As will be seen from the above description, the four blocks $BK_{11}$ to $BK_{22}$ have the same circuit structure. A desired block can be selected by supplying a voltage signal to a selection line ($S_1$ or $S_2$) so that a corresponding selection transistor ($ST_{1a}$, $ST_{2a}$, $ST_{3a}$ or $ST_{4a}$) is turned on so that a potential of a corresponding main column line ($B_1$ or $B_2$) is transferred to the sub column line connected to the turned-on selection transistor. Provision of these selection transistors $ST_{1a}$, $ST_{2a}$, $ST_{3a}$ and $ST_{4a}$ makes it possible to completely isolate the memory cells in units of block.

Incidentally, the row lines $W_1$ to $W_8$ and the selection lines $S_1$ and $S_2$ are controlled by a row decoder $PC_1$, and the main column lines $B_1$ and $B_2$ are controlled by a peripheral circuit $PC_2$ including a column decoder, sense amplifiers and a write circuit which are not shown in the drawing.

Figure 2:
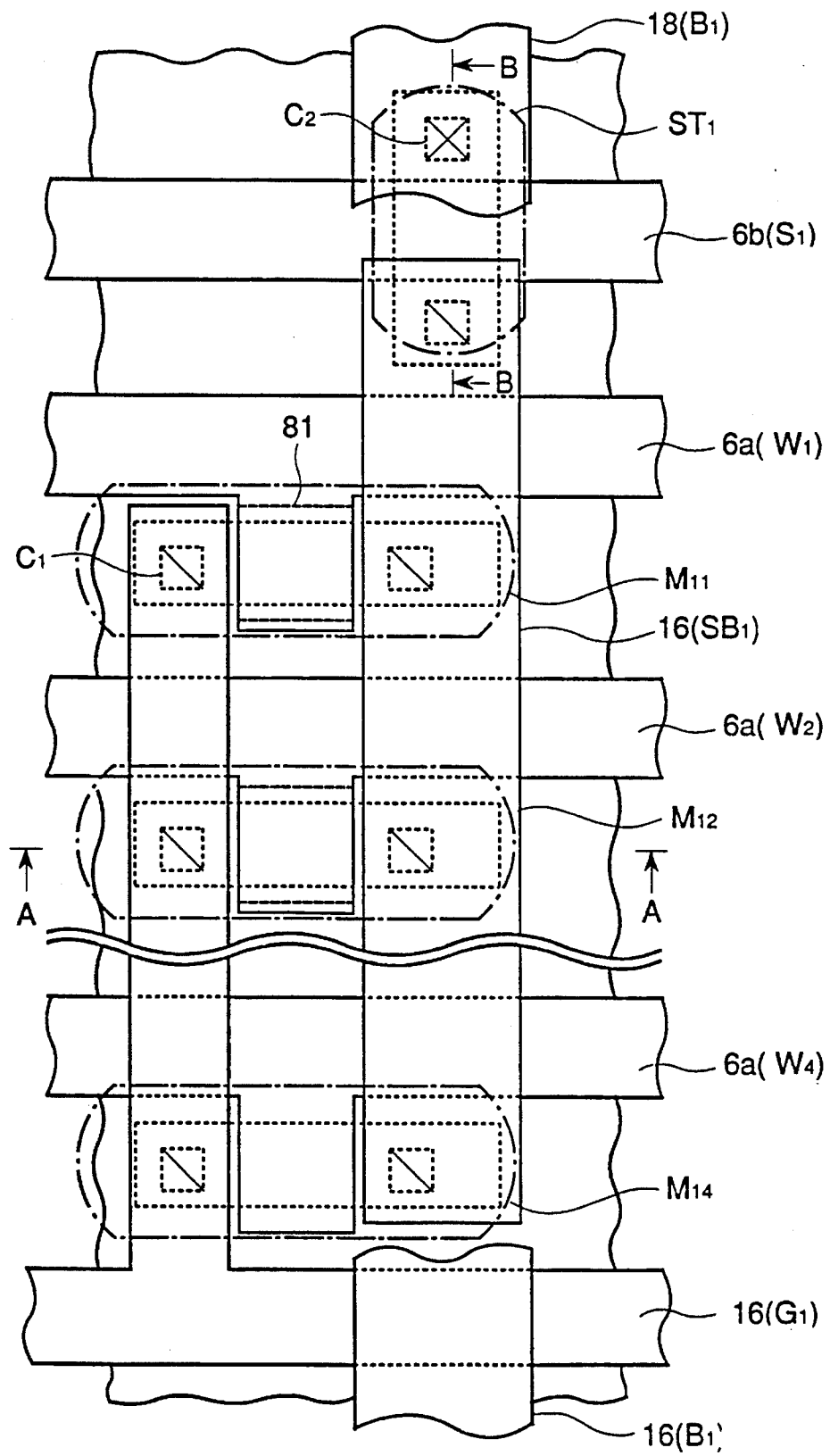
FIG. 2 is a layout pattern diagram of an actual flash memory having the circuit construction shown in FIG. 1.
Figure 3A:
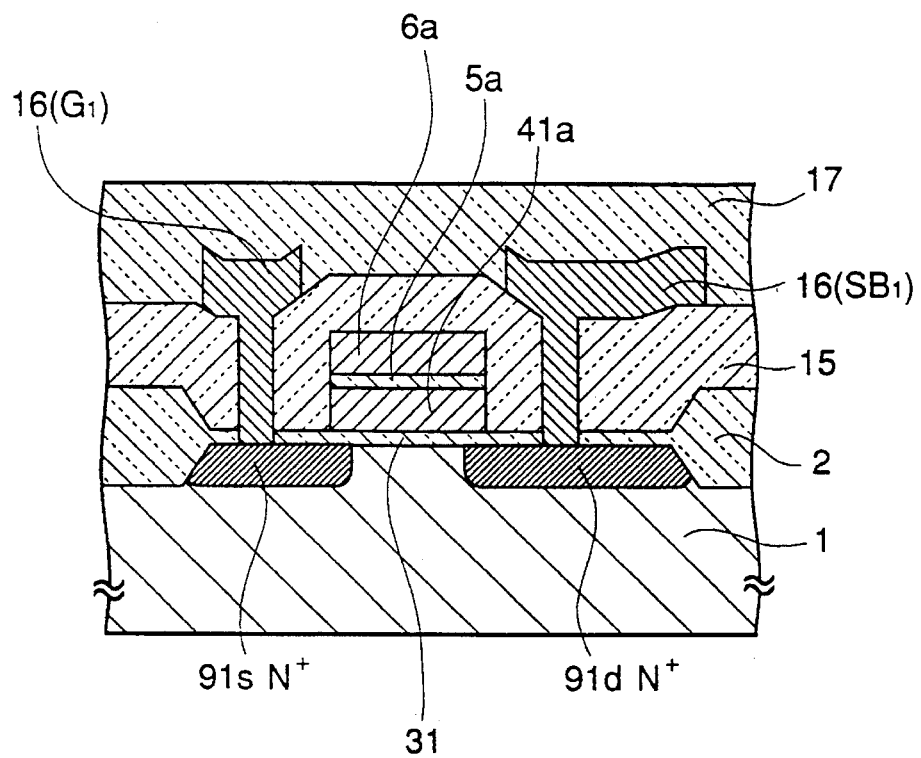
FIGS. 3A and 3B are diagrammatic sectional views taken along the lines A—A and B—B in FIG. 2.
Figure 3B:
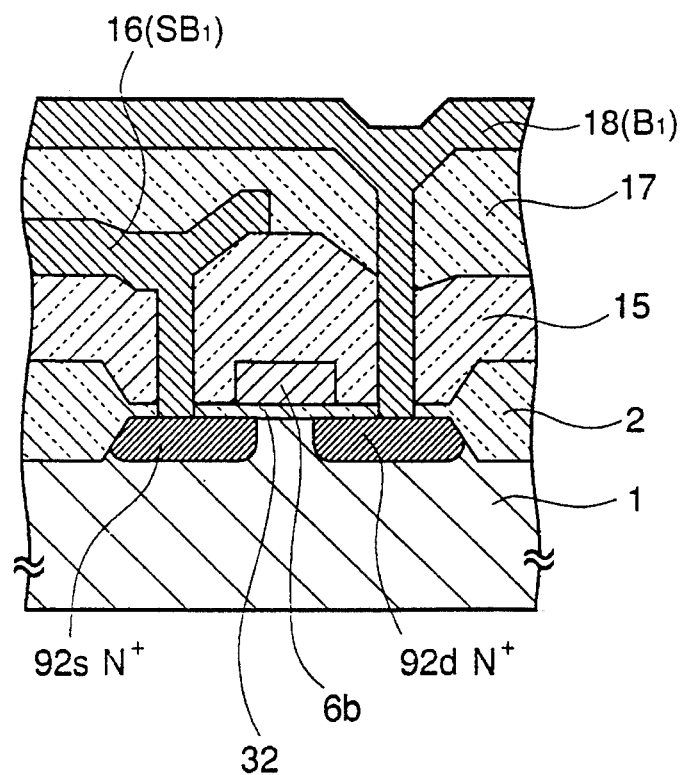
Figure 4A:
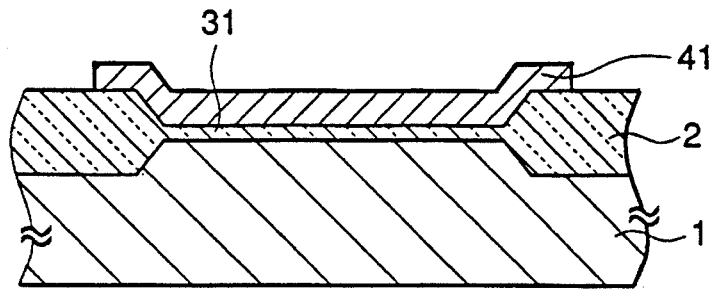
FIGS. 4A to 4D illustrating a conventional process for manufacturing the memory cell included in the non-volatile semiconductor memory shown in FIG. 1.
Figure 4B:
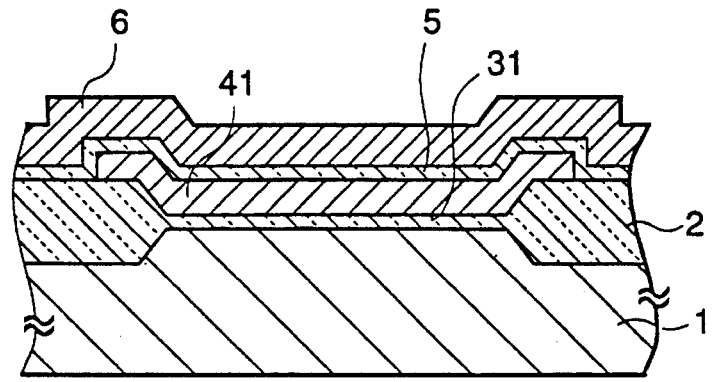
Figure 4C:
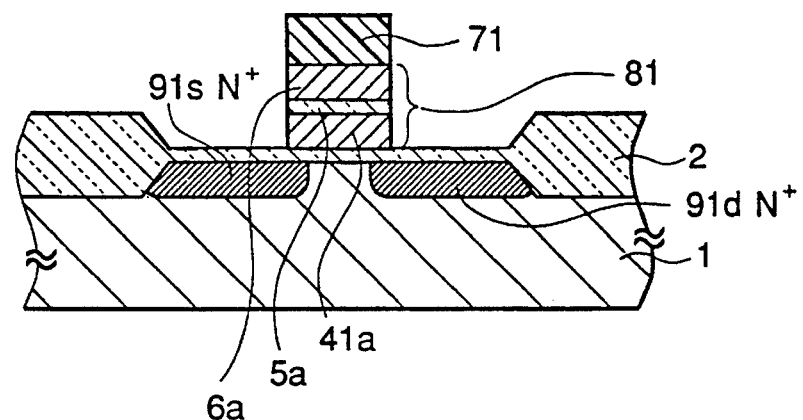
Figure 4D:
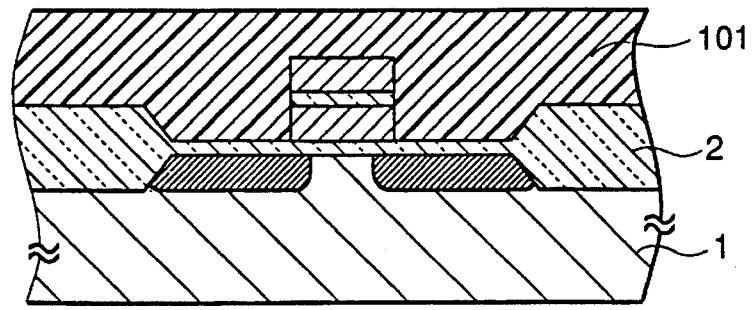
Figure 5A:
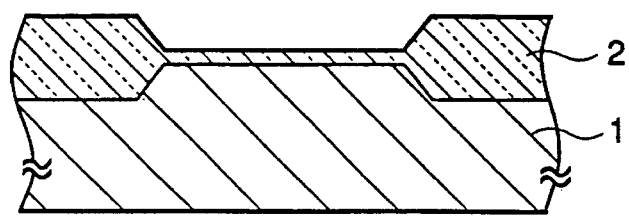
FIG. 5A to 5D illustrating a conventional process for manufacturing the selection transistor included in the non-volatile semiconductor memory shown in FIG. 1.
Figure 5B:
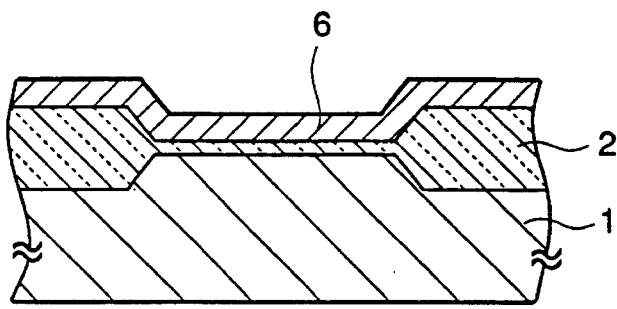
Figure 5C:
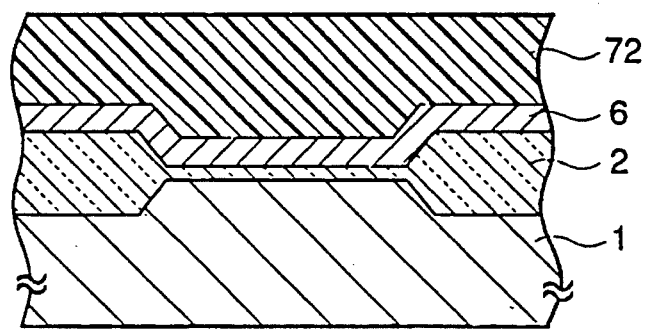
Figure 5D:
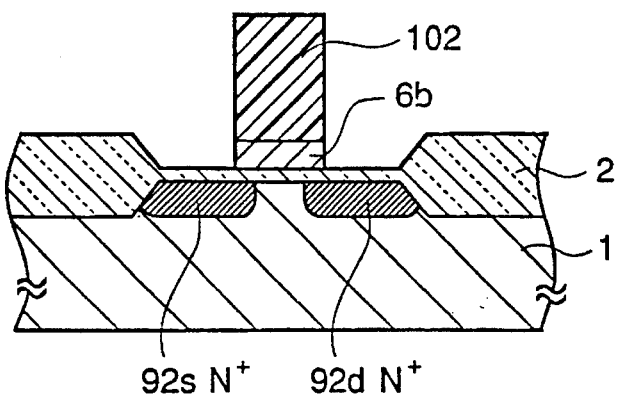
Figure 6A:
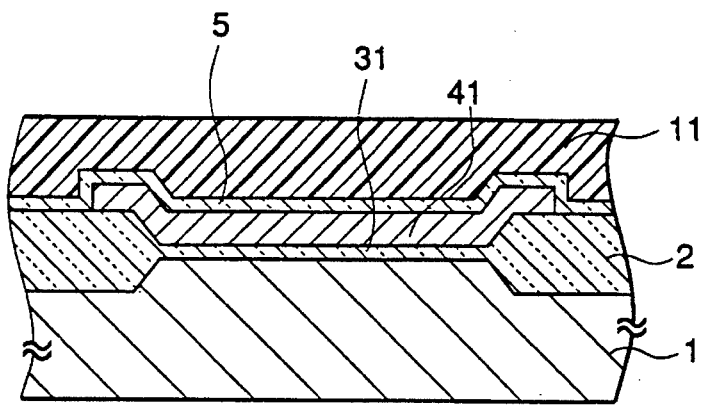
FIGS. 6A to 6D illustrating another conventional process for manufacturing the memory cell included in the non-volatile semiconductor memory shown in FIG. 1.
Figure 6B:
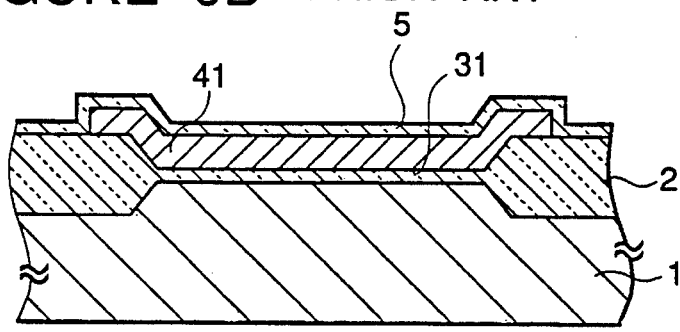
Figure 6C:
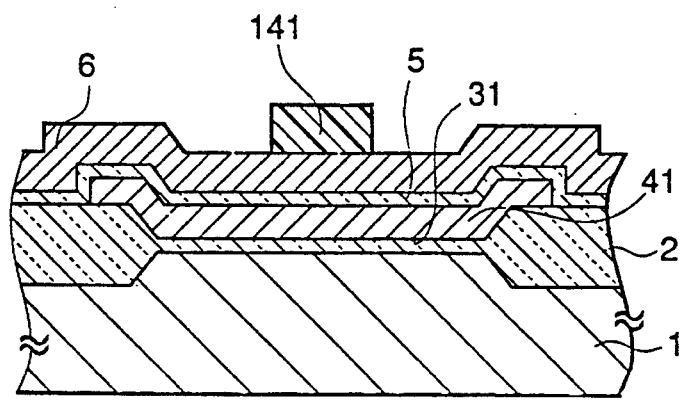
Figure 6D:
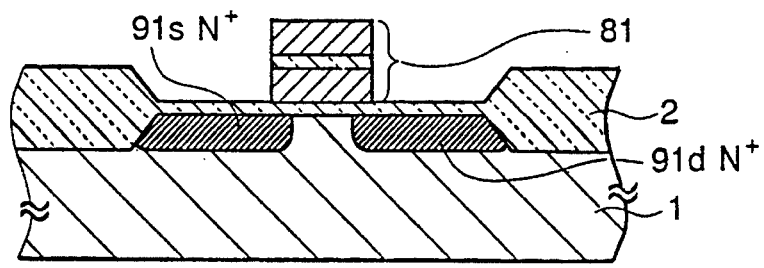
Figure 7A:
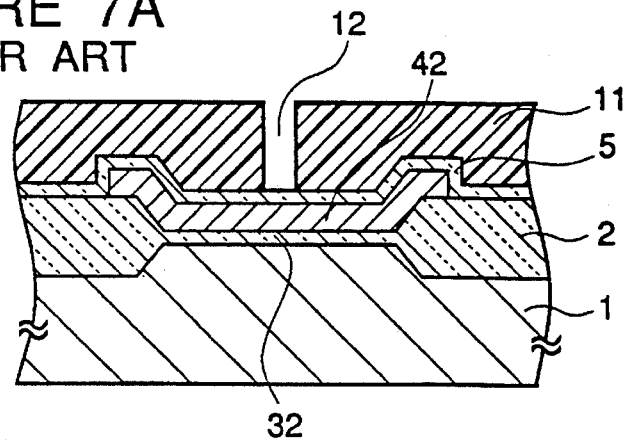
FIG. 7A to 7D illustrating another conventional process for manufacturing the selection transistor included in the non-volatile semiconductor memory shown in FIG. 1.
Figure 7B:
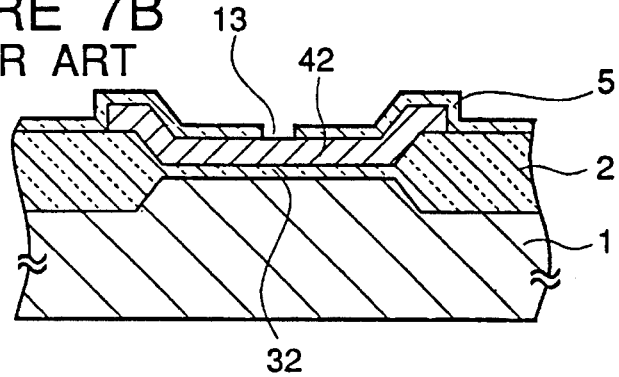
Figure 7C:
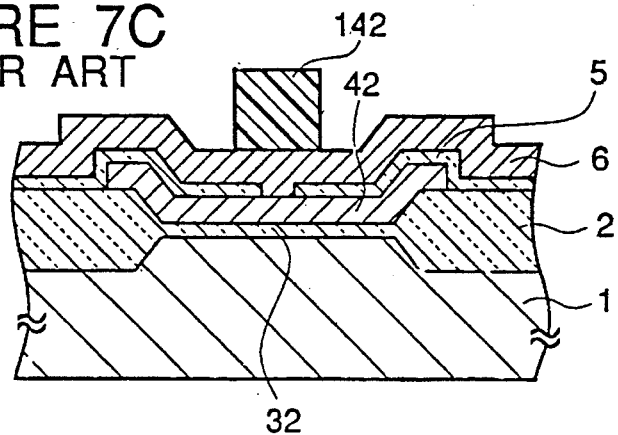
Figure 7D:
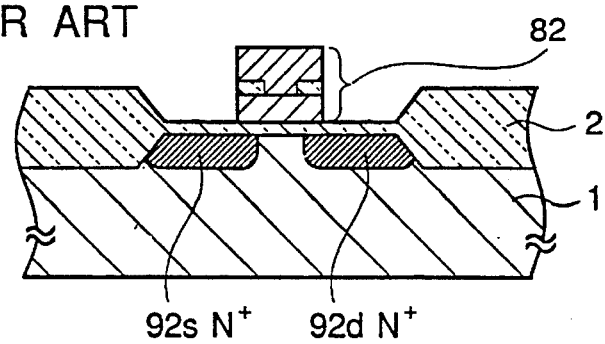
Figure 9:
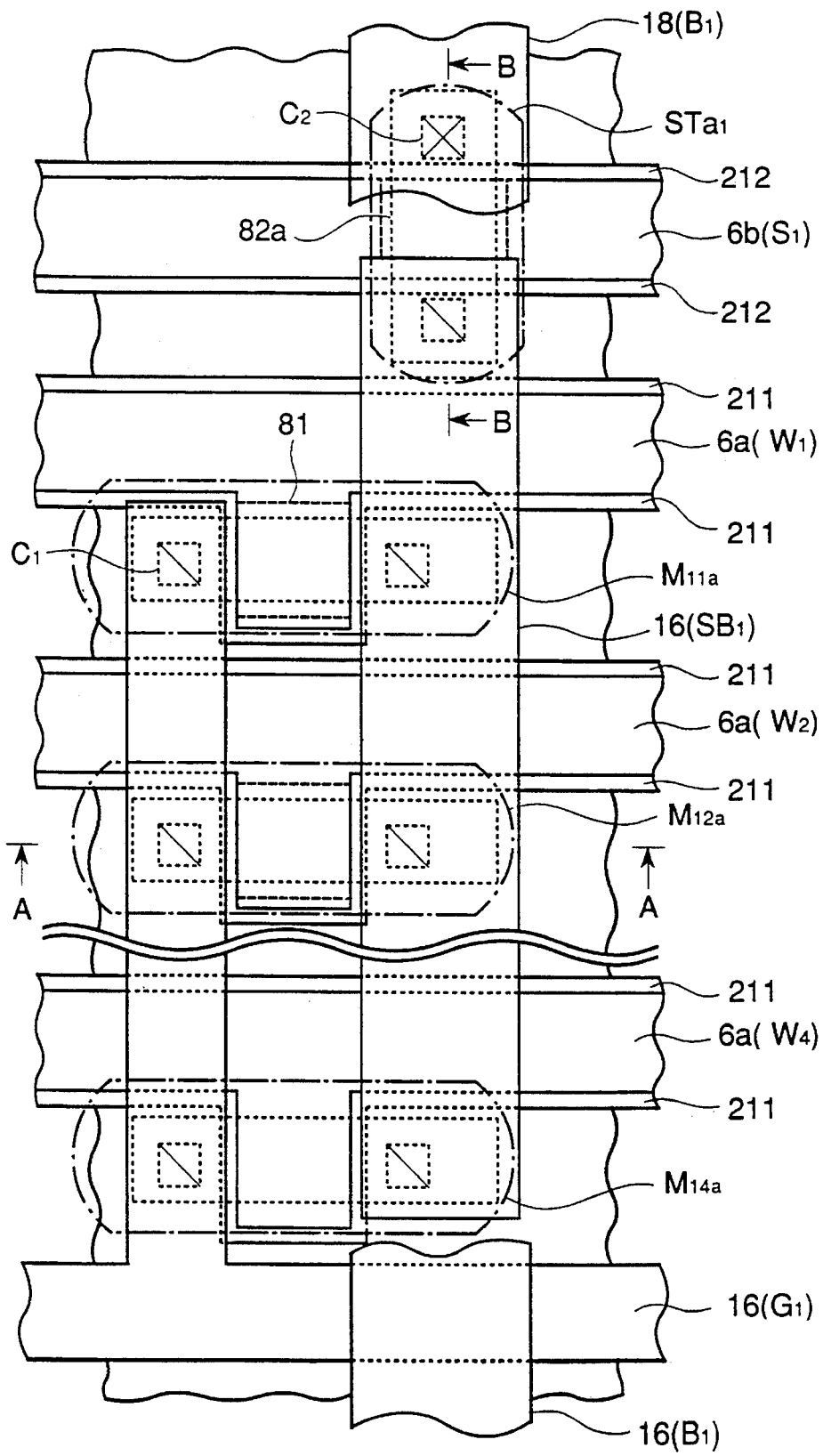
FIG. 9 is a layout pattern diagram of an actual flash memory having the circuit construction shown in FIG. 8.
Figure 10A:
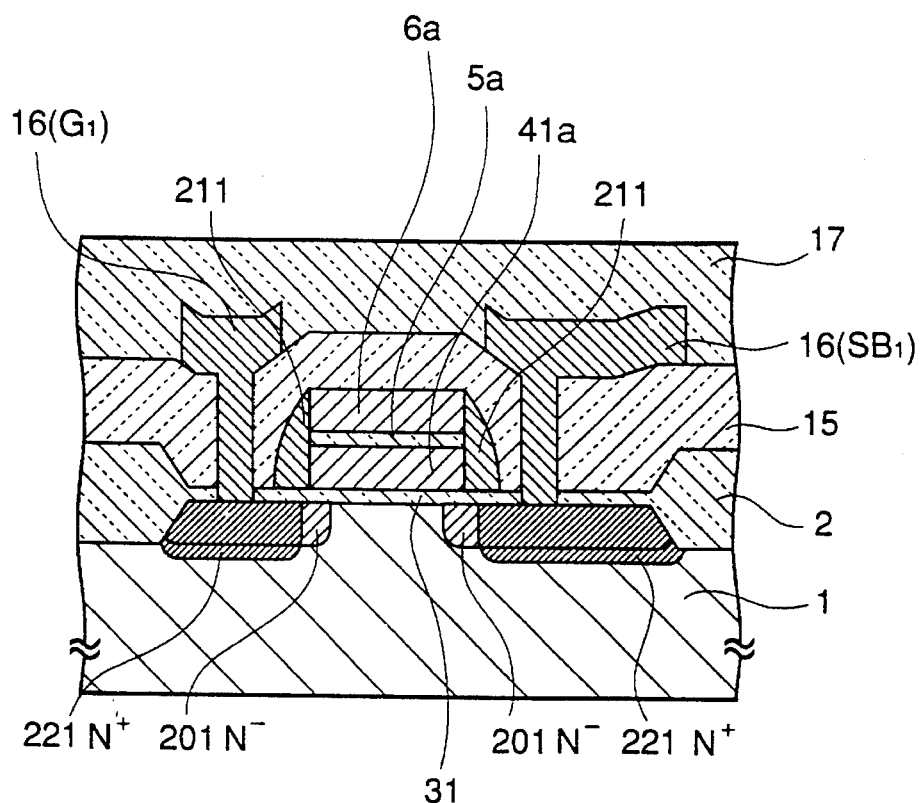
FIGS. 10A and 10B are diagrammatic sectional views taken along the lines A—A and B—B in FIG. 9.
Figure 10B:
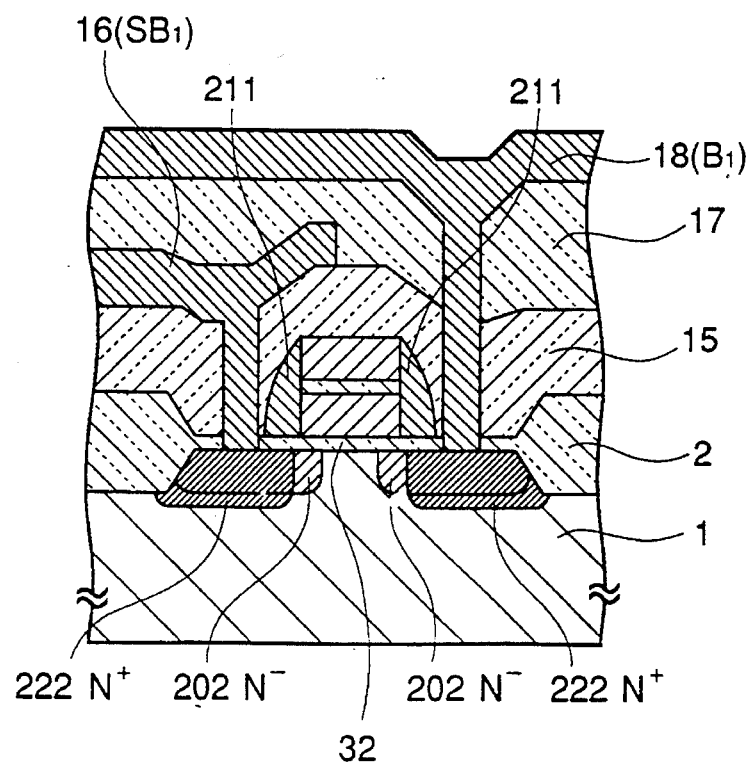

Referring to FIGS. 9, 10A and 10B, FIG. 9 illustrates a layout pattern diagram of an actual flash memory having the circuit construction shown in FIG. 8, and FIGS. 10A and 10B shows diagrammatic sectional views taken along the lines A—A and B—B in FIG. 9. In this embodiment, both of the memory cell and the selection transistor have a stacked gate structure having a floating gate electrode. In FIGS. 9, 10A and 10B, elements corresponding to those shown in FIGS. 2, 3A and 3B are given the same Reference Numerals or Signs.

Now, the process in accordance with the present application for manufacturing the memory cell and the selection transistor in the embodiment shown in FIGS. 10A and 10B, will be described with reference to FIGS. 11 A to 11D and FIG. 12A to 12D, since the structure shown in FIGS. 9, 10A and 10B should become spontaneously apparent if the manufacturing process is described. FIGS. 11A to 11D illustrates a process for manufacturing the memory cell, and FIG. 12A to 12D illustrates a process for manufacturing the selection transistor. In FIGS. 11A to 11D and FIG. 12A to 12D, elements corresponding to those shown in FIGS. 4A to 4D and FIG. 4A to 4D are given the same Reference Numerals or Signs.

Figure 11A:
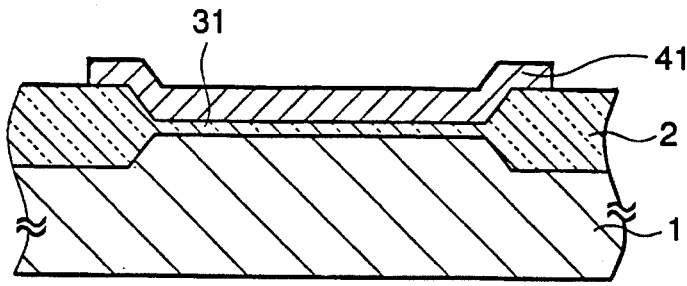
FIGS. 11A to 11D illustrating a conventional process for manufacturing the memory cell shown in FIG. 10A.
Figure 11B:
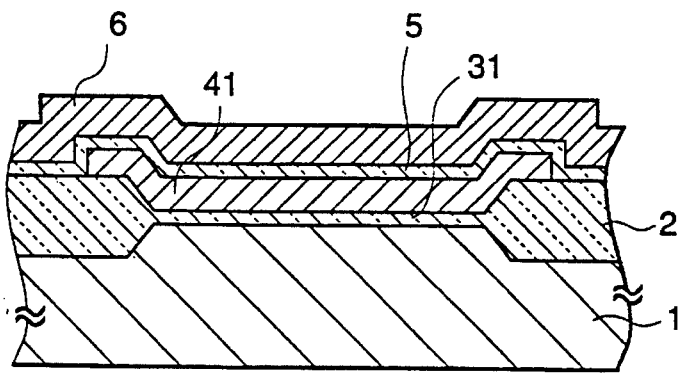
Figure 12A:
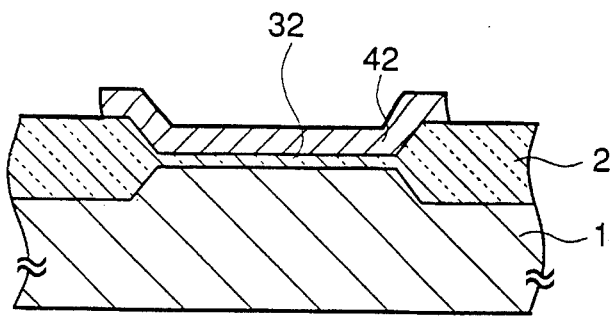

First, as shown in FIGS. 11A and 12A, on a principal surface of a P-type silicon substrate having the impurity concentration of $10^{16}$ to $10^{17}$ cm$^{-3}$ a field oxide film 2 (device isolation structure) having a thickness on the order of 500 nm is formed so as to partition first and second device formation regions. The memory cell will be formed in the first device formation region, and the selection transistor will be formed in the second device formation region.

An oxide silicon film having a thickness of about 10 nm is formed as a first gate insulator film 31 in the first device formation region, and an oxide silicon film having a thickness of about 20 nm is formed as a second gate insulator film 32 in the second device formation region.

Furthermore, a first polysilicon film having a thickness of about 150 nm is deposited to cover the whole surface, and then patterned to form a first floating gate polysilicon film 41 which covers the first device formation region and its neighboring area surrounding the first device formation region, and a second floating gate polysilicon film 42 which covers the second device formation region and its neighboring area surrounding the second device formation region.

Figure 12B:
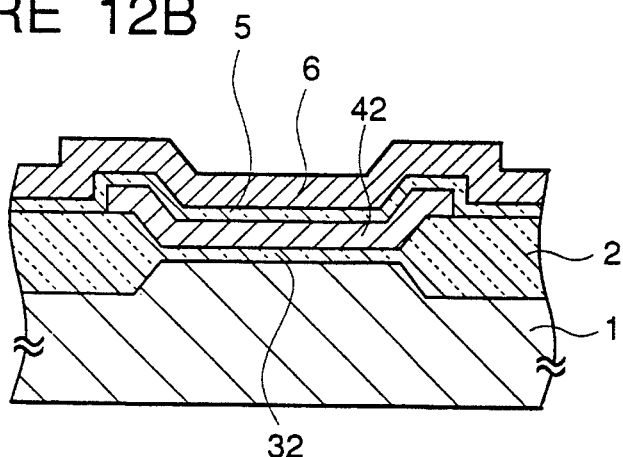

Thereafter, as shown in FIGS. 11A and 12B, a third insulator film 5 and a second polysilicon film 6 are formed to cover the whole surface in the named order. The third insulator film 5 is formed of an oxide silicon film having a thickness on the order of 15 to 30 nm, preferably, 20 nm.

Figure 11C:
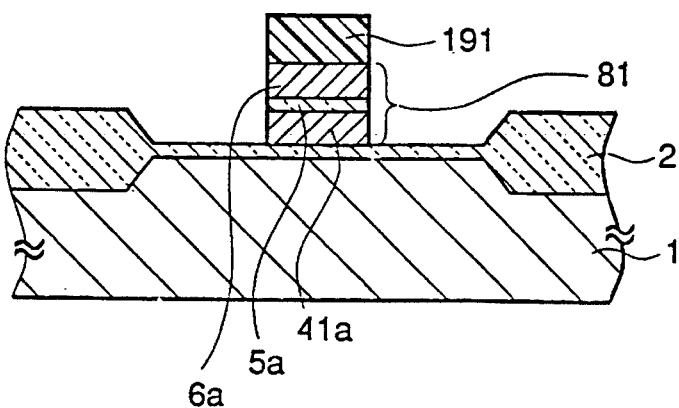
Figure 12C:
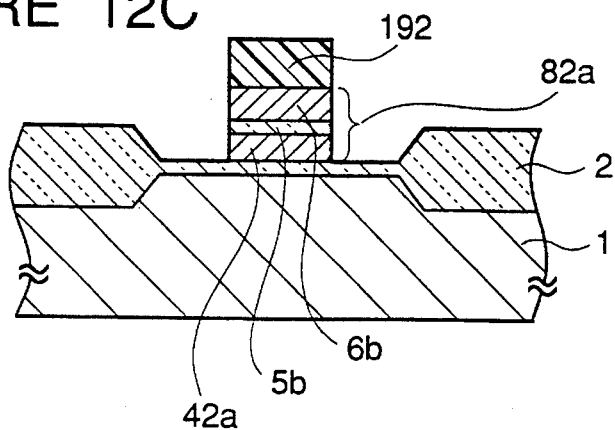
Figure 12C:
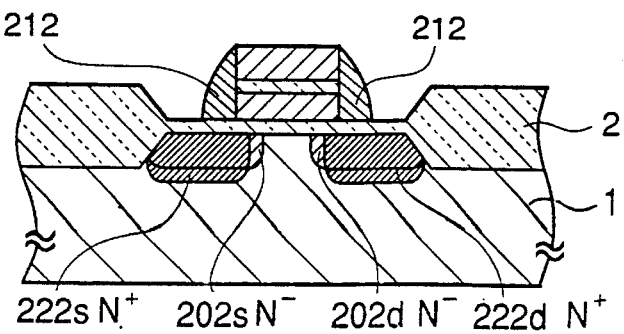

Then, as shown in FIGS. 11C and 12C, a photoresist layer 191 and 192 is formed to cross over the first and second device formation regions. Furthermore, the second polysilicon film 6, the third gate insulator film 5 and the first and second floating gate polysilicon films 41 and 42 are etched in the named order, so as to form stacked gate structures 81 and 82a, respectively. The stacked gate structure 81 for the memory cell is composed of a floating gate electrode 41a, a third gate insulator film 5a and a control gate electrode 6a, which is integral with and connected to a word line 6a ($W_1$), 6a ($W_2$), ..., 6a ($W_4$) extending in a row direction. The stacked gate structure 82a for the selection transistor is composed of a floating gate electrode 42a, a third gate insulator film 5b and a control gate electrode 6b, which is integral with and connected to a selection line $6b$ ($S_1$). Here, the floating gate electrode of each memory cell and each selection transistor is separated from one another.

Figure 11D:
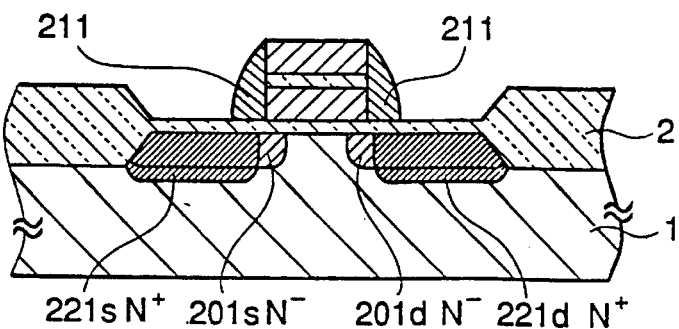

Next, as shown in FIGS. 11D and 12D, phosphorus (P) is ion-implanted using the stacked gate structures 81 and 82a as a mask, so that N-type diffused layers 201s, 201d, 202s and 202d having a low impurity concentration (for example on the order of $10^{17}$ to $10^{19}$ cm$^{-3}$) are formed. Then, an oxide silicon film having a thickness of for example 150 nm is deposited on the whole surface, and an anisotropic etching is performed so that spacers 211 and 212 are formed on side walls of each of the stacked gate structures 81 and 82a. Furthermore, arsenic (As) is implanted using the stacked gate structures 81 and 82a and the side wall spacers 211 and 212 as a mask, so that N-type diffused layers 221s, 221d, 222s and 222d having a high impurity concentration (for example, on the order of $10^{20}$ to $10^{21}$ cm$^{-3}$) are formed.

Thus, the source and the drain of each of the memory cell and the selection transistor has a so called LDD (lightly doped drain) structure having a double impurity diffused layer containing a relatively low impurity concentration phosphorus and a relatively high impurity concentration arsenic.

Thereafter, similarly the conventional example, sub column lines 16 ($SB_1$), ..., source lines 16 ($G_1$), ..., and also main bit lines 18 ($B_1$) are formed to obtained the structure as shown in FIGS. 9, 10A and 10B.

As can be seen from the above the embodiment is different from the conventional examples in that both of the selection transistors $ST_{1a}$, $ST_{2a}$, $ST_{3a}$ and $ST_{4a}$ and the memory cells $M_{11a}$ to $M_{18a}$ and $M_{21a}$ to $M_{28a}$ have the stacked gate structure (in which the floating gate is not connected to the control gate) and the LDD structure.

In the above mentioned memory cell having the stacked gate structure, similarly to the conventional examples, the memory operation is performed by changing the threshold level between a low threshold level condition (about 2 V) and a high threshold level condition (about 7 V). In this embodiment it is assumed that the low threshold level condition is a written condition and the high threshold level condition is an erased condition.

In order to bring the memory cells $M_{11a}$ to $M_{14a}$ and $M_{21a}$ to $M_{24a}$ into the erased condition for example, the main bit lines $B_1$ and $B_2$, the P-silicon substrate 1 and the source lines $G_1$ and $G_2$ are all brought to 0 V (ground potential). Furthermore, 15 V is applied to only the word lines $W_1$ to $W_4$, and the other word lines $W_5$ to $W_8$ are set at 0 V.

In addition, the first and second selection lines $S_1$ and $S_2$ are set to 5 V, respectively. In the memory cells $M_{11a}$ to $M_{14a}$ and $M_{21a}$ to $M_{24a}$, accordingly, electrons are injected from the P-silicon substrate to the floating gate electrode through the first gate insulator film between the floating gate electrode and the silicon substrate by action of the Fowler-Nordhelm tunnelling. As a result the memory cell is brought into the high threshold level condition having the threshold on the order of 7 V.

On the other hand in the case of selecting and writing for example the memory cell $M_{14a}$ (storing of data), the main bit line $B_1$ is brought to 5 V, and the main bit line $B_2$, the P-silicon substrate 1 and the source lines $G_1$ and $G_2$ are all set to 0 V. $-13$ V is applied to only the word line $W_4$ also acting as the control gate electrode of the memory cell $M_{14a}$, and the other word lines $W_1$ to $W_3$ an $W_5$ to $W_8$ are set to 0 V. The first and second selection lines $S_1$ and $S_2$ are set to 5 V and 0 V, respectively.

In this case, a potential difference of $-18$ V is applied between the drain region of the memory cell $M_{14a}$ and the control gate $W_4$, so that electrons are discharged from the floating gate electrode to the silicon substrate through the first gate insulator film between the floating gate electrode and the silicon substrate, by action of the Fowler-Nordheim tunnelling.

As the result of the fact that the electrons has been drawn from the floating gate, the potential of the floating gate electrode is caused to elevate to a positive level. Therefore, the threshold of the memory cell $M_{14a}$ is shifted toward a negative direction. As mentioned above, the threshold level of the written memory cell is ordinarily set on the order of 2 V.

In the above mentioned writing and erasing, (1) since in the selection transistors $ST_{1a}$, $ST_{2a}$, $ST_{3a}$ and $ST_{4a}$, the third gate insulator film is thicker than the first gate insulator film, and (2) since only 5 V is applied to the selection lines $S_1$ and $S_2$, the Fowler-Nordheim tunnelling is actually negligible, and therefore, the threshold of the selection transistors do not substantially vary.

Figure 13:
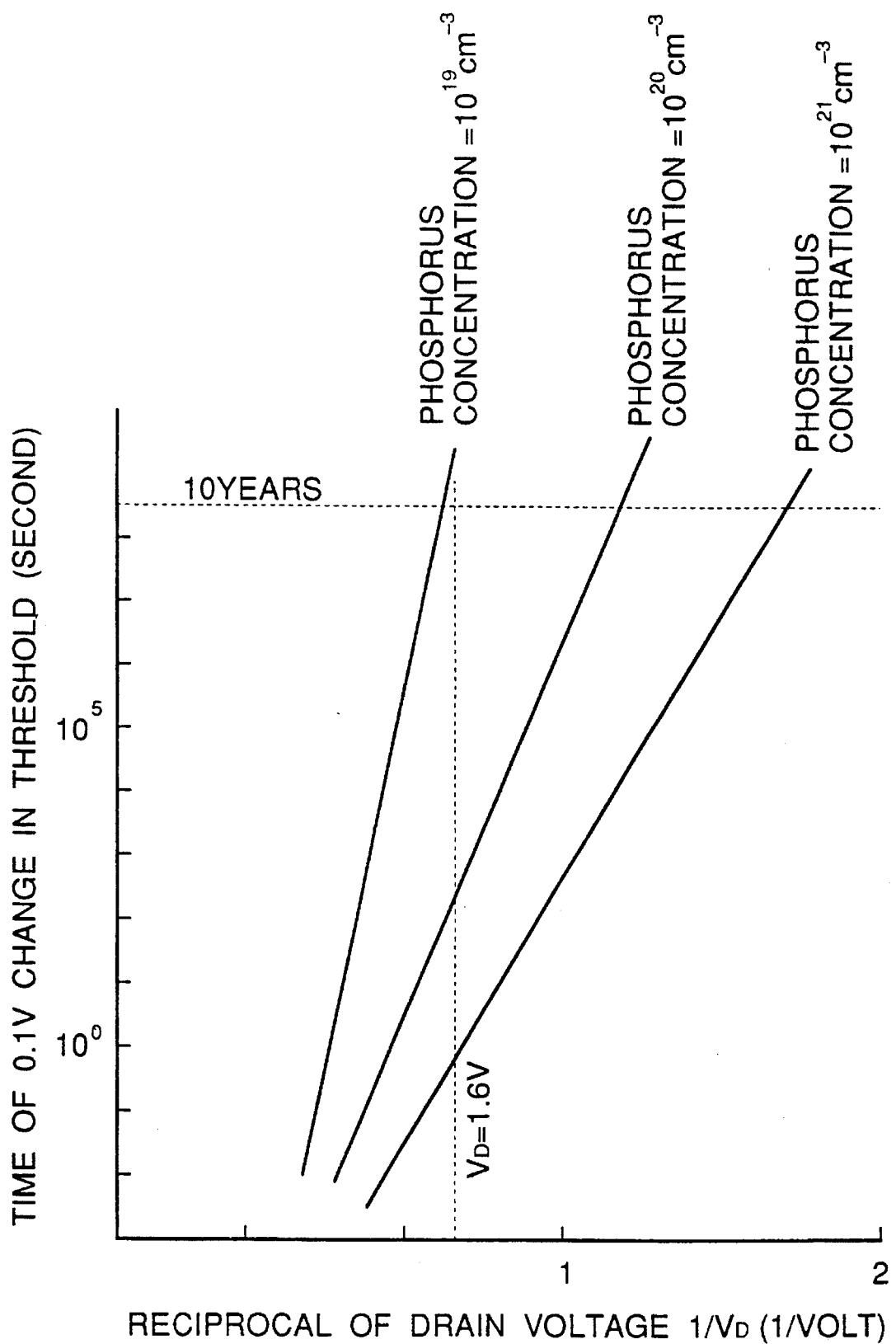
FIG. 13 is a graph illustrating the change of the threshold of the selection transistor in one embodiment of the non-volatile semiconductor memory in accordance with the present invention.

Referring to FIG. 13, there is shown a characteristics graph illustrating the evaluation of the threshold change when the selection transistor in accordance with the present invention was maintained in a continuously operating condition. If the concentration of the low impurity concentration diffused layers is $10^{19}$ cm$^{-3}$ at maximum, the threshold change of the selection transistor is not greater than 0.1 V in a ten-year continuous operation under the condition that, in operation, the gate voltage is 5 V and the drain voltage does not exceed 1.6 V. This causes no practical problem. The reason for this is that since the transistor has the LDD structure, generation of hot carriers is suppressed. In addition, the memory cells themselves has the LDD structure, the variation of the threshold in the reading operation is minimized. Therefore, reliability is elevated. Otherwise, it is possible to reduce the size of the memory cells.

In the manufacturing process, the memory cells and the selection transistors can be simultaneously formed in the same manufacturing steps excluding the steps for forming the second gate insulator film. Accordingly, the manufacturing process can be simplified. In addition, since it is no longer necessary to connect the floating gate polysilicon film and the control gate polysilicon film for formation of the selection transistor, the lithographic steps can be reduced in comparison with the conventional process explained with reference to FIGS. 6A to 7D. Furthermore, it is possible to reduce the size of the gate since no contact hole is formed in the gate insulator film between the floating gate electrode and the control gate electrode.

Moreover, it is possible to determine the gate length and channel width of the selection transistor, independently of the memory cells.

Accordingly, reliability and integration density can be further elevated.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory including:

a plurality of blocks each having a plurality of memory cells located at intersections between a plurality of row lines and at least one sub column line; and at least one main column line connected to said at least one sub column line of each of said blocks through a selection transistor, both said memory cells and said selection transistor having a floating gate electrode and a control gate electrode, at least said selection transistor having a drain region which has a lightly doped drain structure in which a low impurity concentration diffused region is located at a channel side thereof.

2. A non-volatile semiconductor memory claimed in claim 1 wherein said low impurity concentration diffused region has a maximum impurity concentration of $10^{19}$ cm$^{-3}$.

3. A non-volatile semiconductor memory claimed in claim 1 wherein in said selection transistor, a gate insulator film between said floating gate electrode and said control gate electrode is thicker than that between a channel surface and said floating gate electrode.

* * * * *